(12) United States Patent
Wehner et al.

(10) Patent No.: US 10,957,560 B2
(45) Date of Patent: Mar. 23, 2021

(54) PRESSURE SINTERING PROCEDURE IN WHICH POWER SEMICONDUCTOR COMPONENTS WITH A SUBSTRATE ARE CONNECTED TO EACH OTHER VIA A SINTERED CONNECTION

(71) Applicant: SEMIKRON ELEKTRONIK GMBH & CO. KG, Nuremberg (DE)

(72) Inventors: Alexander Wehner, Nuremberg (DE); Juergen Steger, Hiltpoltstein (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 97 days.

(21) Appl. No.: 16/364,311

(22) Filed: Mar. 26, 2019

(65) Prior Publication Data
US 2019/0333781 A1 Oct. 31, 2019

(30) Foreign Application Priority Data
Apr. 26, 2018 (DE) ...................... 10 2018 110 132.5

(51) Int. Cl.
*H01L 21/48* (2006.01)
*H01L 23/367* (2006.01)
(Continued)

(52) U.S. Cl.
CPC ........ *H01L 21/4882* (2013.01); *H01L 23/367* (2013.01); *H01L 23/3735* (2013.01);
(Continued)

(58) Field of Classification Search
None
See application file for complete search history.

(56) References Cited

U.S. PATENT DOCUMENTS

2005/0230820 A1* 10/2005 Licht ...................... H01L 24/82
257/720
2010/0078463 A1* 4/2010 Speckels ............... H01L 25/072
228/212
(Continued)

FOREIGN PATENT DOCUMENTS

DE 10 2010 020 696 11/2011
DE 10 2012 213 003 2/2013
(Continued)

OTHER PUBLICATIONS

German Appln. Serial No. 10 2018 110 132.5 dated Sep. 12, 2018, 5 pages—German, pages—English.

*Primary Examiner* — Nilufa Rahim
(74) *Attorney, Agent, or Firm* — Andrew F. Young; Nolte Lackenbach Siegel

(57) ABSTRACT

The invention provides a pressure sintering method including: a) providing a sintered component arrangement with a workpiece carrier having recesses, with a substrate resting on a main surface of the workpiece carrier, wherein a sintering material to be sintered is arranged between the power semiconductor components and the substrate, a first power semiconductor component and a first region of the substrate arranged above the workpiece carrier in the normal direction of the first main side of the insulation layer flush with a first recess of the workpiece carrier, and a second power semiconductor component and a second region of the substrate are arranged above the workpiece carrier in the normal direction of the first main side of the insulation layer flush with a second recess of the workpiece carrier and a step of b) pressurizing the power semiconductor components and applying a temperature treatment.

13 Claims, 3 Drawing Sheets

(51) Int. Cl.
  *H01L 23/373*     (2006.01)
  *H01L 23/00*      (2006.01)
  *H01L 25/07*      (2006.01)
  *H01L 25/00*      (2006.01)

(52) U.S. Cl.
  CPC .............. *H01L 24/32* (2013.01); *H01L 24/83* (2013.01); *H01L 25/072* (2013.01); *H01L 25/50* (2013.01); *H01L 2224/32225* (2013.01); *H01L 2224/8384* (2013.01)

(56) References Cited

U.S. PATENT DOCUMENTS

| | | | | |
|---|---|---|---|---|
| 2011/0031608 | A1* | 2/2011 | Kim | H01L 23/142 257/692 |
| 2011/0075451 | A1* | 3/2011 | Bayerer | H01L 24/06 363/37 |
| 2012/0080799 | A1* | 4/2012 | Hohlfeld | H01L 25/072 257/772 |
| 2012/0306087 | A1* | 12/2012 | Bayerer | H01L 24/83 257/772 |
| 2013/0285234 | A1* | 10/2013 | Uhlemann | H01L 23/3735 257/712 |
| 2015/0021750 | A1* | 1/2015 | Fujino | H01L 23/36 257/667 |
| 2015/0115452 | A1* | 4/2015 | Yoon | H01L 24/32 257/762 |
| 2015/0325494 | A1* | 11/2015 | Kroneder | H01L 23/3675 361/715 |
| 2016/0111395 | A1* | 4/2016 | Heinrich | H01L 23/49503 257/724 |
| 2018/0190611 | A1* | 7/2018 | Tatsumi | H01L 24/83 |
| 2018/0286771 | A1* | 10/2018 | Oya | H01L 23/053 |
| 2019/0006193 | A1* | 1/2019 | Wedi | H01L 23/3735 |
| 2020/0219782 | A1* | 7/2020 | Hitomi | H01L 25/072 |

FOREIGN PATENT DOCUMENTS

| | | |
|---|---|---|
| DE | 10 2015 120 156 | 5/2017 |
| DE | 10 2018 110 132 | 11/2018 |

\* cited by examiner

PRESSURE SINTERING PROCEDURE IN WHICH POWER SEMICONDUCTOR COMPONENTS WITH A SUBSTRATE ARE CONNECTED TO EACH OTHER VIA A SINTERED CONNECTION

CROSS REFERENCE TO RELATED APPLICATIONS

This application relates to, and claims priority from, DE Ser. No.: 10 2018 110 132.5 filed on Apr. 26, 2018, the entire contents of which are incorporated herein by reference.

FIGURE SELECTED FOR PUBLICATION

FIG. 1.

BACKGROUND OF THE INVENTION

Field of the Invention

The present invention relates to a pressure sintering method in which power semiconductor components with a substrate are connected to each other using a sintered connection

Description of the Related Art

DE 10 2015 120 156 A1 discloses a pressure sintering method in which power semiconductor components with a substrate are connected to each other using a sintered connection. In said method, the substrate, which has conductor tracks and on which power semiconductor components are arranged, a material to be sintered being arranged between the power semiconductor components and the conductor tracks, is placed on a pressure counterpart of a sintering press. This is followed by a pressurization of the power semiconductor components by means of a pressure stamp of a sintering press in the direction of the pressure counterpart and application of a temperature treatment to the sintering material, wherein in doing so the sintering material is converted into a sintered metal, thereby forming the sintered connection of the power semiconductor components to a substrate. As a result of different thermal expansion coefficients of the substrate, in particular an electrically non-conductive insulation layer of the substrate (e.g. ceramic plate) and of the sintered metal and the power semiconductor components, as a result of the mechanical stresses arising between these components during the hardening stage, concave areas can be formed in the substrate on the side of the substrate facing away from the power semiconductor components in the normal direction of the insulation layer of the substrate flush with the power semiconductor components, so that the side of the substrate facing away from the power semiconductor components is no longer flat. In order to produce a power semiconductor device, the side of the substrate facing away from the power semiconductor components is arranged on a base plate or on a heat sink. The concave areas increase the thermal contact resistance of the substrate with the base plate or the heat sink, which is technically undesirable, as it leads to less effective cooling of the power semiconductor components.

ASPECTS AND SUMMARY OF THE INVENTION

The object of the invention is to specify a pressure sintering method wherein power semiconductor components with a substrate can be connected to each other using a sintering connection, wherein the opposite side of the substrate from the power semiconductor components is designed in such a way that it can be arranged on a base plate or a heat sink with a low thermal contact resistance with the metallic base plate or the heat sink.

This object is achieved by a pressure sintering method having the following consecutive steps:

providing a sintered component arrangement with a workpiece carrier having recesses, with a substrate resting on a main surface of the workpiece carrier and having an electrically non-conductive insulation layer, on the first main side of which facing away from the workpiece carrier a metallization layer structured to form conductor tracks is arranged, having power semiconductor components arranged on the conductor tracks, wherein a sintering material to be sintered is arranged between the power semiconductor components and the conductor tracks, wherein a first power semiconductor component and a first region of the substrate are arranged above the workpiece carrier in the normal direction of the first main side of the insulation layer flush with a first recess of the workpiece carrier, and a second power semiconductor component and a second region of the substrate are arranged above the workpiece carrier in the normal direction of the first main side of the insulation layer flush with a second recess of the workpiece carrier, and pressurizing the power semiconductor components in the direction of the workpiece carrier and applying a temperature treatment to the sintering material, wherein a portion of the first region of the substrate is pressed into the first recess and a portion of the second region of the substrate is pressed into the second recess and the sintering material is converted into a sintered metal.

Further configurations and extensions of the invention are obtained from the dependent claims.

It proves to be advantageous if in method step a) all power semiconductor components of the sintered component arrangement are arranged above the workpiece carrier in the normal direction of the first main side of the insulation layer respectively flush with a respective recess of the workpiece carrier associated with the respective power semiconductor component, and a respective region of the substrate is arranged above the workpiece carrier in the normal direction of the first main side of the insulation layer flush with a respective recess of the workpiece carrier, and in method step b) a portion of this particular region of the substrate is pressed into the respective recess, since all power semiconductor components of the sintered component arrangement can then be coupled to a metallic baseplate or to a heat sink with high thermal conductance.

It also proves to be advantageous if in method step a) a surface of the workpiece carrier bounding the respective recess has a concave profile, since then, when part of the first region of the substrate is pressed into the first recess and part of the second area of the substrate is pressed into the second recess, the risk of cracks occurring in the substrate is very low.

It also proves to be advantageous if the profile of the surface of the workpiece carrier at the respective transition from the main surface of the workpiece carrier, on which the substrate rests in method step a), to a surface of the workpiece carrier bounding the respective recess is continuously differentiable, since then, when part of the first region of the substrate is pressed into the first recess and part of the second area of the substrate is pressed into the second recess, the risk of cracks occurring in the substrate is reduced.

In addition, it proves to be advantageous if in method step a) the position at which the respective recess has the greatest depth is arranged flush with a central region of the respective power semiconductor component in the normal direction of the first main side of the insulation layer, because then the bulging areas of the substrate formed in method step b) have their greatest height in the normal direction of the first main side of the insulation layer flush with the central region of the respective power semiconductor component.

It also proves to be advantageous if the greatest depth of the respective recess is 20 µm to 150 µm, in particular 40 µm to 120 µm, since the side of the substrate facing away from the power semiconductor components is then formed in such a way that this can be arranged on a base plate or a heat sink with a particularly low thermal contact resistance relative to the metallic base plate or the heat sink.

In addition, it proves to be advantageous if in method step a) a main surface facing the respective recess of the respective power semiconductor component in the normal direction of the first main side of the insulation layer, projected onto a virtual surface enclosed by the rim of the respective recess whose normal direction corresponds to the normal direction of the first main side of the insulation layer, is located within this virtual surface, since then the side of the substrate facing away from the power semiconductor components is designed in such a way that this can be arranged on a base plate or a heat sink with a particularly low thermal contact resistance relative to the metallic base plate or the heat sink.

In this context, it proves to be advantageous if the corners of the main surface of the respective power semiconductor component facing the respective recess in the normal direction of the first main side of the insulation layer, projected onto the rim of the respective recess are located on the rim of the respective recess, since then the size of the opening of the respective recess is matched to the size of the respective power semiconductor component.

In addition, it proves to be advantageous if in method step a) a virtual surface enclosed by the rim of the respective recess whose normal direction corresponds to the normal direction of the first main side of the insulation layer, in the normal direction of the first main side of the insulation layer projected onto a main surface of the respective power semiconductor element is located within this main surface of the respective power semiconductor element, since the side of the substrate facing away from the power semiconductor components is then formed in such a way that this can be arranged on a base plate or a heat sink with a particularly low thermal contact resistance relative to the metallic base plate or the heat sink.

In addition, it proves to be advantageous if in method step a) in at least one of the power semiconductor components a main surface of this at least one power semiconductor component facing the respective recess has a square shape, wherein a virtual surface enclosed by the rim of the recess associated with this at least one power semiconductor component, whose normal direction corresponds to the normal direction of the first main side of the insulation layer, has a circular shape, because the shape of the opening of the recess is then matched to the shape of the power semiconductor component in such a way that after the sintering, the bulging regions of the substrate can readily disappear as the components cool.

It additionally proves to be advantageous if in method step a) in at least one of the power semiconductor components a main surface of this at least one power semiconductor component facing the respective recess has a rectangular shape, wherein a virtual surface enclosed by the rim of the recess associated with this at least one power semiconductor component, whose normal direction corresponds to the normal direction of the first main side of the insulation layer, has an elliptical shape, because the shape of the opening of the recess is then matched to the shape of the power semiconductor component in such a way that after the sintering, the bulging regions of the substrate can readily disappear as the components cool.

It is also proves to be advantageous if in method step a) the rim of the recess associated with the respective power semiconductor component at non-corner regions of the respective power semiconductor component extends parallel to rim edges of the respective power semiconductor component, wherein at corner regions of the respective power semiconductor component the rim of the recess associated with the respective power semiconductor component has a curved profile, because the shape of the opening of the recess is then matched to the shape of the power semiconductor component in such a way that after the sintering, the bulged regions of the substrate can readily regain their shape as the components cool.

In this context it proves advantageous if in method step a) the rim of the recess associated with the respective power semiconductor component is spaced apart from the rim edges of the respective power semiconductor component in the direction perpendicular to the normal direction of the first main side of the insulation layer, wherein the rim of the recess is arranged in the direction perpendicular to the normal direction of the first main side of the insulation layer closer to or further away from a projection of the central region of the respective power semiconductor component extending in the normal direction of the first main side of the insulation layer than the rim edges of the respective power semiconductor component.

It is also proves advantageous if in method step a) the workpiece carrier has at least one stop means, which counteracts a movement of the substrate in the direction perpendicular to the normal direction of the first main side of the insulation layer. This facilitates an exact positioning of the substrate on the workpiece carrier and during the pressurization of the power semiconductor components significantly reduces the risk of displacement of the substrate in relation to the workpiece carrier in the direction perpendicular to the normal direction of the first main side of the insulation layer.

It proves to be additionally advantageous if between method step a) and method step b), in a method step a') the sintered component arrangement is arranged on a pressure counterpart of a sintering press, and in method step b) the power semiconductor components are pressurized in the direction of the workpiece carrier, by means of a pressure stamp of the sintering press which is movable in the direction of the pressure counterpart. This achieves a rational production process in which the power semiconductor components are connected in a materially-bonded and electrically conductive manner to the conductor tracks of the substrate by means of a respective sintered connection.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
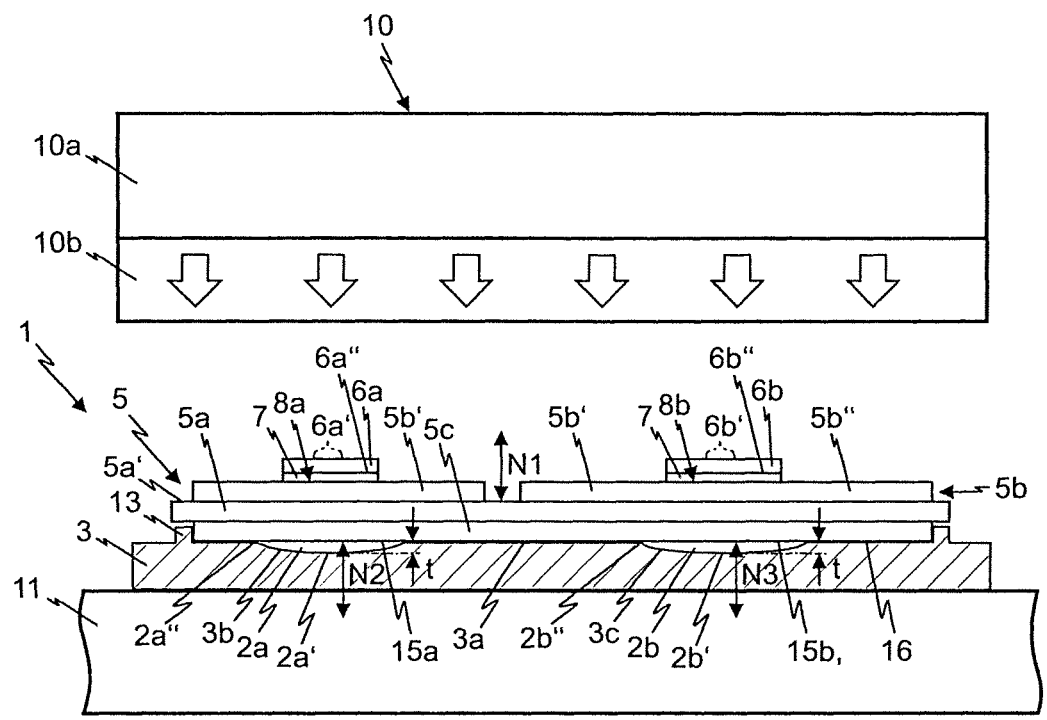
FIG. 1 is a cross-sectional view of a sintered component arrangement which is arranged in a sintering press, in a state before the application of pressure to power semiconductor components of the sintered component arrangement by the sintering press.

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'link' or 'connect' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

In the present text, numerous specific details are set forth in order to provide a thorough understanding of exemplary versions of the present invention. It will be apparent, however, to one skilled in the art, that some versions of the present invention may possibly be practiced without some of these specific details. Indeed, reference in this specification to "a variant," "variants," preference, and "one/the variant," or "one version" and the like, should be understood to mean that a particular feature, structure, or characteristic described in connection with the variant or version is included in at least one such variant or version according to the disclosure. Thus, the appearances of phrases such as "in one variant," "in one version," and the like, in various places in the specification are not necessarily all referring to the same version or variant, nor are separate or alternative versions or variants mutually exclusive of other versions or variants. Moreover, various features may be described which possibly may be exhibited by some variants or versions and not by others. Similarly, various requirements are described which may be requirements for some variants or versions, but not others. Furthermore, as used throughout this specification, the terms 'a', 'an', 'at least' do not denote a limitation of quantity, but rather denote the presence of at least one of the referenced item, in the sense that singular reference of an element does not necessarily exclude the plural reference of such elements. Concurrently, the term "a plurality" denotes the presence of more than one referenced items. Finally, the terms "connected" or "coupled" and related terms are used in an operational sense and are not necessarily limited to a direct connection or coupling.

Various operations may be described as multiple discrete operations in turn, in a manner that may be helpful in understanding embodiments of the present invention; however, the order of description should not be construed to imply that these operations are order dependent.

Identical elements in the figures are labeled with the same reference numerals. It should also be noted that in FIGS. 3 to 6, in the plan view shown elements that are not actually visible and their reference numeral arrows are shown by dashed lines. The sectional views of FIGS. 1 and 2 show the section along the cutting line A shown in FIG. 3.

Figure 2:
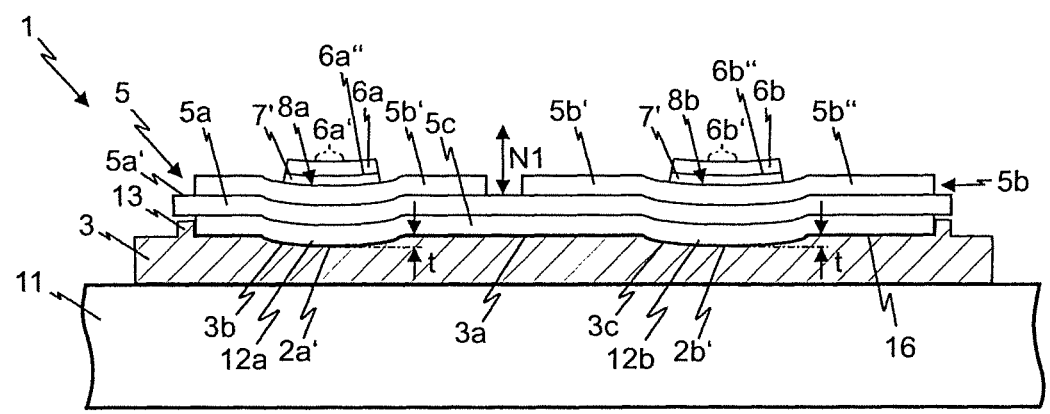
FIG. 2 is a cross-sectional view of a sintered component arrangement on a pressure counterpart of a sintering press during a pressurization of the power semiconductor components by the sintering press.
Figure 3:
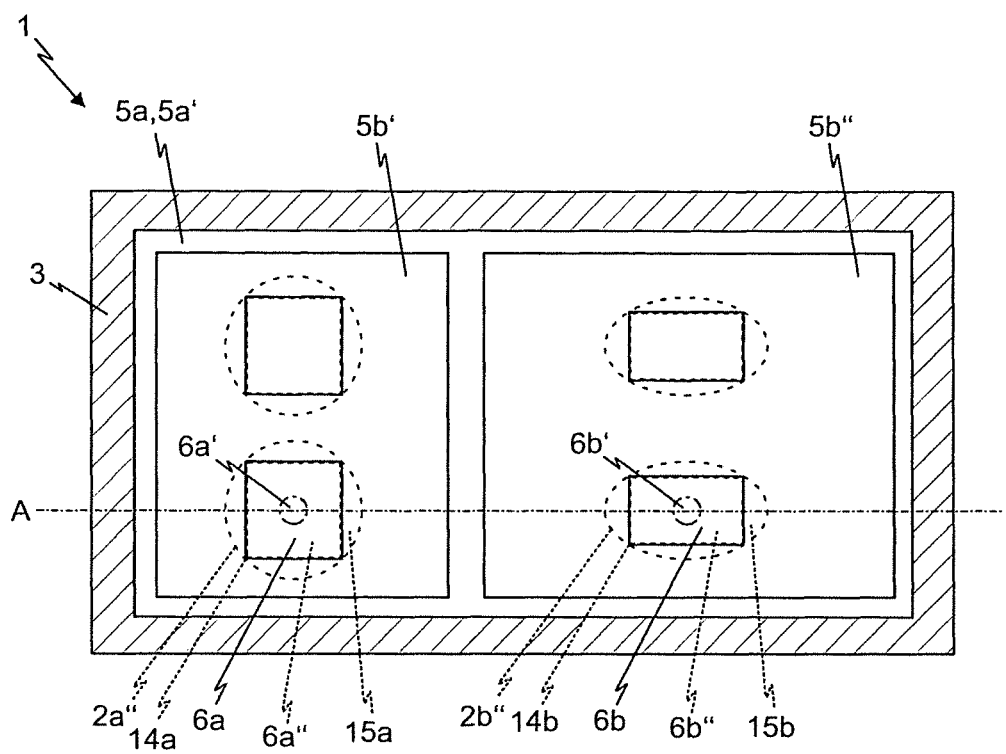
FIG. 3 is a plan view of the sintered component arrangement.

FIG. 1 illustrates a cross-sectional view of a sintered component arrangement 1 which is arranged in a sintering press, in a state before the application of pressure to power semiconductor components 6a and 6b of the sintered component arrangement 1 by the sintering press. FIG. 3 shows a plan view of the sintered component arrangement 1 shown in FIG. 1.

In the pressure sintering method according to the invention, a first method step a) consists of providing the sintered component arrangement 1. The sintered component arrangement 1 has a workpiece carrier 3 comprising a first recess 2a and a second recess 2b. The sintered component arrangement 1 also comprises a substrate 5 resting on a preferably flat main surface 3a of the workpiece carrier 3 and having an electrically non-conductive insulation layer 5a, on the first main side 5a' of which facing away from the workpiece carrier 3 a metallization layer 5b is arranged, which is structured to form conductor tracks 5b' and 5b". The substrate 5 has a mechanical contact with the main surface 3a of the workpiece carrier 3. The recesses 2a and 2b extend from the main surface 3a of the workpiece carrier 3 into the workpiece carrier 3a. The conductor tracks 5b' and 5b" are arranged spaced apart from each other on the insulation layer 5a. The conductor tracks 5b' and 5b" are arranged on the insulation layer 5a electrically insulated from each other. The insulation layer 5a is preferably designed as a ceramic plate. The substrate 3 preferably has a further structured or unstructured metallization layer 5c arranged on the insulation layer 5a, wherein the insulation layer 5a is arranged between the metallization layer 5b and the further metallization layer 5c. The metallization layer 5b or 5c is connected in a materially bonded manner to the insulation layer 5a. The substrate 3 can be implemented, for example, as a direct copper bonded substrate (DCB substrate) or as an active metal brazing substrate (AMB substrate). Alternatively, the substrate 3 can also be implemented as an Insulated Metal Substrate (IMS substrate).

The sintered component arrangement 1 has power semiconductor components 6a and 6b arranged on the conductor tracks 5b' and 5b". A sinter material 7 to be sintered, preferably present in the form of an industry-standard sinter paste, is arranged between the power semiconductor components 6a and 6b and the conductor tracks 5b' and 5b". The sinter material 7, in particular the sinter paste, contains metal particles, e.g. of silver. The respective power semiconductor component preferably exists in the form of a power semiconductor switch or a diode. The respective power semiconductor switch preferably exists in the form of a transistor, such as an IGBT (Insulated Gate Bipolar Transistor) or in the form of a MOSFET (Metal Oxide Semiconductor Field Effect Transistor) or thyristor.

A first power semiconductor component 6a and a first region 8a of the substrate 5 are arranged above the workpiece carrier 3 in the normal direction N1 of the first main side 5a' of the insulation layer 5a, aligned flush with a first recess 2a of the workpiece carrier 3. A second semiconductor component 6b and a second region 8b of the substrate 5 are arranged above the workpiece carrier 3 in the normal direction N1 of the first main side 5a' of the insulation layer 5a, aligned flush with a second recess 2b of the workpiece carrier 3. The workpiece carrier 3 is preferably constructed of metal.

A surface 3b or 3c of the workpiece carrier 3, which bounds the respective recess 2a or 2b, as illustrated for example in FIG. 1, has a concave profile. The profile of the respective recess 2a or 2b surface 3b or 3c of the workpiece carrier 3 is preferably continuously differentiable, so that the surface 3b or 3c of the workpiece carrier 3 bounding the respective recess 2a or 2b has no edges which could result in damage to the substrate 5 later during the pressurization.

The profile of the surface of the workpiece carrier 3 at the respective transition from the main surface 3a of the workpiece carrier 3, on which the substrate 5 rests, to the surface 3b or 3c of the workpiece carrier 3 bounding the respective recess 2a or 2b, is preferably continuously differentiable so that at the respective transition no edges are present, which could later result in damage to the substrate 5 during the pressurization.

The position 2a' or 2b' at which the respective recess 2a or 2b has the greatest depth t is preferably arranged in the normal direction N1 of the first main side 5a' of the insulation layer 5 flush with a central region 6a' or 6b' of the respective power semiconductor component 6a or 6b. The greatest depth t of the respective recess 2a or 2b is preferably 20 μm to 150 μm, in particular 40 μm to 120 μm and in particular 100 μm.

As shown in the examples in FIG. 1 and FIG. 3, a main surface 6a" or 6b" of the respective power semiconductor component 6a or 6b facing the respective recess 2a or 2b in the normal direction N1 of the first main side 5a' of the insulation layer 5a, projected onto a virtual surface 15a, 15b enclosed by the rim 2a" or 2b" of the respective recess 2a or 2b, whose normal direction N2 or N3 corresponds to the normal direction N1 of the first main side 5a' of the insulation layer 5a, is preferably located within this virtual surface 15a or 15b. It should be noted with respect to all exemplary embodiments that, expressed in other words, the virtual surface 15a or 15b is the virtual smooth surface of the opening of the respective recess 2a or 2b. The corners 14a or 14b of the main surface 6a' or 6b' of the respective power semiconductor component 6a or 6b facing the respective recess 2a or 2b are preferably located in the normal direction N1 of the first main side 6a' of the insulation layer 6a, when projected onto the rim 2a" or 2b" of the respective recess 2a or 2b, on the rim 2a" or 2b" of the respective recess 2a or 2b.

Figure 4:
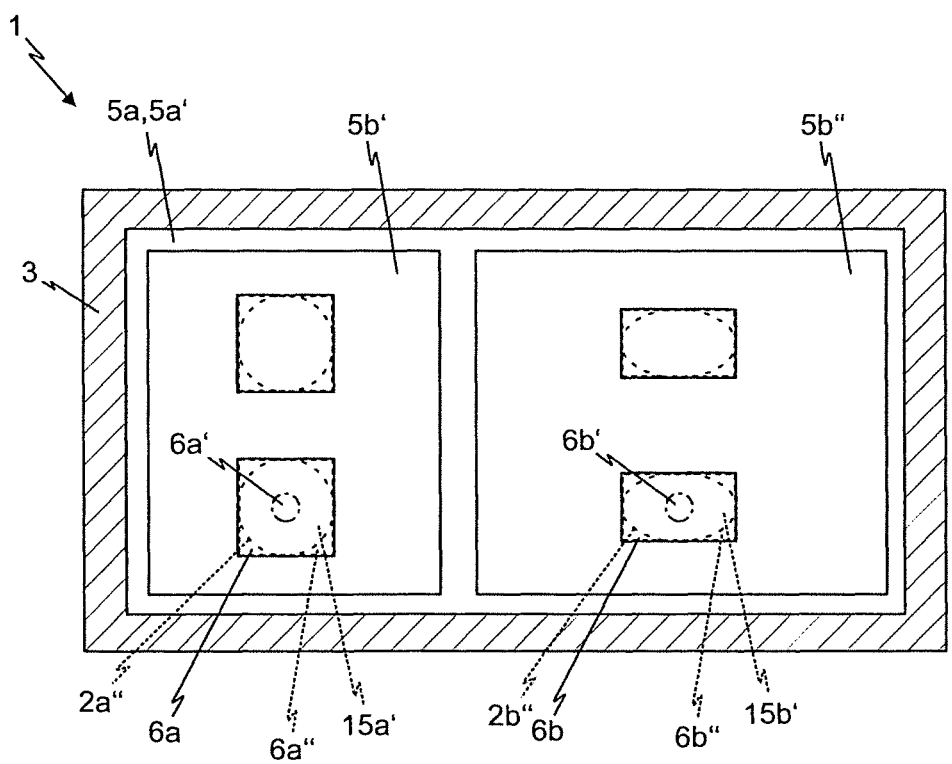
FIG. 4 is a plan view of a further sintered component arrangement.

Alternatively, as in the example shown in FIG. 4, the virtual surface 15a' or 15b' enclosed by the rim 2a" or 2b" of the respective recess 2a, 2b, whose normal direction N2, N3 corresponds to the normal direction N1 of the first main side 5a' of the insulation layer (5a), in the normal direction N1 of the first main side 5a' of the insulation layer 5a when projected onto a main surface 6a" or 6b" of the respective power semiconductor component 6a or 6b facing the respective recess 2a or 2b, are located within said main surface 6a" or 6b" of the respective power semiconductor component 6a or 6b.

As in the examples shown in FIG. 3 and FIG. 4, in at least one of the power semiconductor components 6a and 6b, here in the power semiconductor component 6a, a main surface 6a" of this at least one power semiconductor component 6a facing the respective recess 2a can have a square shape, wherein a virtual surface 15a or 15a' enclosed by the rim 2a" of the recess 2a associated with this at least one power semiconductor component 6a, whose normal direction N2 corresponds to the normal direction N1 of the first main side 5a' of the insulation layer 5a, has a circular shape. In the case of a square power semiconductor component, the virtual surface 15a or 15a' therefore preferably has a circular shape. It should be noted that, expressed in other words, the virtual surface 15a or 15a' is the virtual smooth surface of the opening of the respectively associated recess.

As shown in the examples in FIG. 3 and FIG. 4, in at least one of the power semiconductor components 6a and 6b, here in the power semiconductor element 6b, a main surface 6b" of this at least one power semiconductor component 6b facing the respective recess 2b can have a rectangular shape, wherein a virtual surface 15a or 15a' enclosed by the rim 2b" of the recess 2b associated with this at least one power semiconductor component 6b, whose normal direction N3 corresponds to the normal direction N1 of the first main side 5a' of the insulation layer 5a, has an elliptical shape. In the case of a rectangular power semiconductor component, the virtual surface 15b or 15b' therefore preferably has an elliptical shape. It should be noted that, expressed in other words, the virtual surface 15b or 15b' is the virtual plane surface of the opening of the associated recess in each case.

Figure 5:
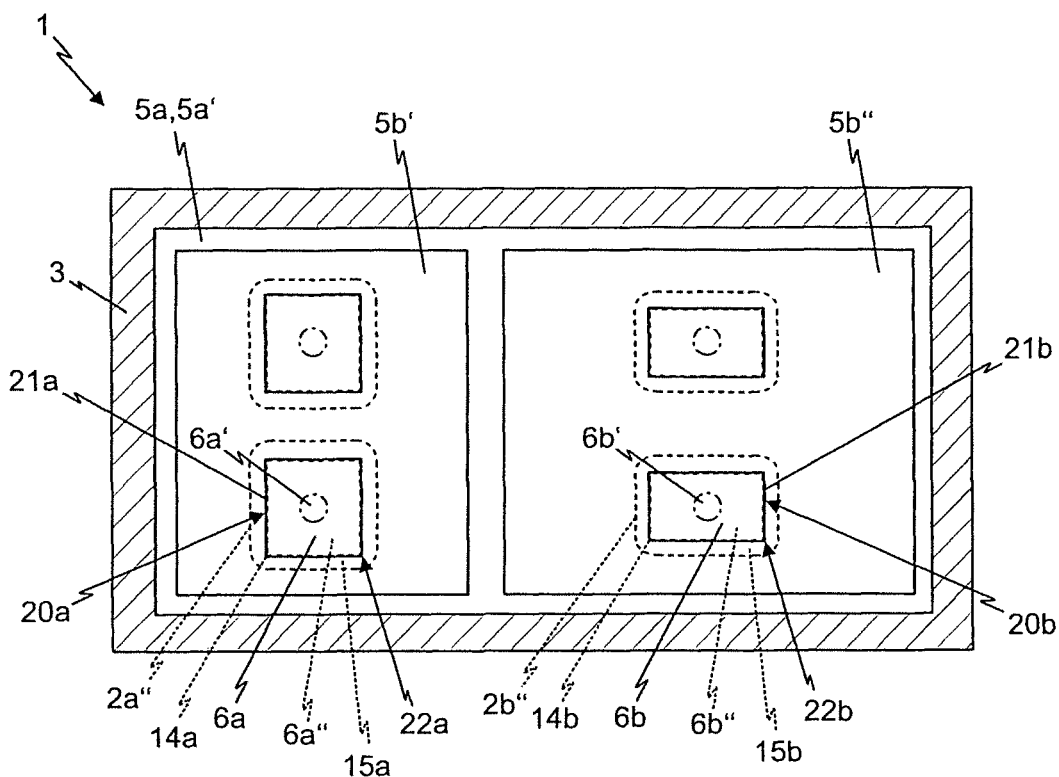
FIG. 5 is a plan view of a further sintered component arrangement.
Figure 6:
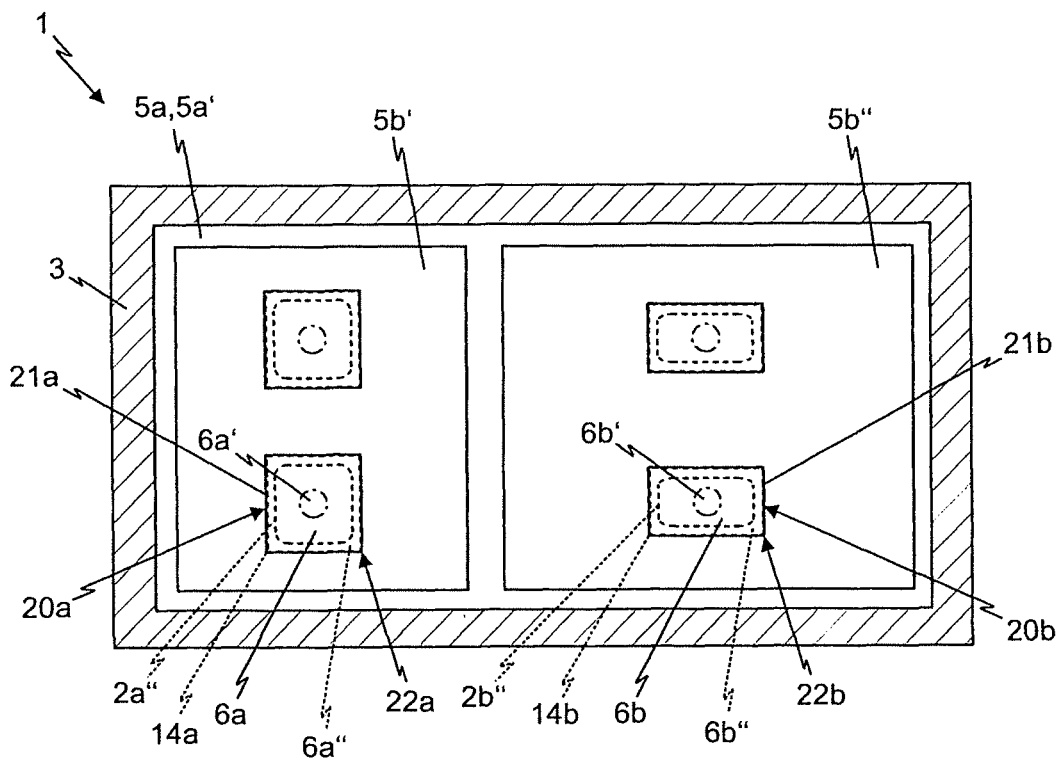
FIG. 6 is a plan view of a further sintered component arrangement.

As shown in the examples of FIG. 5 and FIG. 6, the rim 2a" or 2b" of the recess 2a or 2b associated with the respective power semiconductor component 6a or 6b at non-corner regions 20a or 20b of the respective power semiconductor component 6a or 6b can extend parallel to rim edges 21a or 21b of the respective power semiconductor component 6a or 6b, wherein at corner regions 22a or 22b of the respective power semiconductor component 6a or 6b the rim 2a" or 2b" of the recess 2a or 2b associated with the respective power semiconductor component 6a or 6b has a curved profile, in particular in the form of a circular arc. The rim 2a" or 2b" of the recess 2a or 2b associated with the respective power semiconductor component 6a or 6b is preferably spaced apart from the edges 21a or 21b of the respective power semiconductor component 6a or 6b in the direction perpendicular to the normal direction N1 of the first main side 5a' of the insulation layer 5a. The rim 2a" or 2b" of the recess 2a or 2b in this case is arranged in the direction perpendicular to the normal direction N1 of the first main side 5a' of the insulation layer 5a nearer to (see FIG. 6) or farther away from (see FIG. 5) a projection of the central region 6a' or 6b' of the respective power semiconductor component 6a or 6b extending in the normal direction N1 of the first main side 5a' of the insulation layer 5a than the rim edges 21a or 21b of the respective power semiconductor component 6a or 6b.

The workpiece carrier 3 preferably has at least one stop means 13, which counteracts a movement of the substrate 5 in the direction perpendicular to the normal direction N1 of the first main side 5a' of the insulation layer 5. The at least one stop means 13 is preferably designed as at least one elevation protruding out of the main surface 3a of the workpiece carrier 3.

In a subsequent method step a') an arrangement of the sintered component arrangement 1 on a pressure counterpart 11 of a sintering press is preferably carried out. Alternatively, it could also be possible for the workpiece carrier 2 of the sintered component arrangement 1 to form an integral part of the sintering press.

In the pressure sintering method according to the invention, in a further method step b) pressure is applied to the power semiconductor components 6a and 6b, as indicated by the large arrows in FIG. 1, in the direction of the workpiece carrier 3 and a temperature treatment is applied to the sintering material 7, wherein a portion of the first region 8a of the substrate 5 is pressed into the first recess 2a and a portion of the second region 8b of the substrate 5 is pressed into the second recess 2b and the sintering material 7 is converted into a sintered metal 7'. The conversion of the sintering material 7 into the sintered metal 7 is carried out at least substantially after the first and second region 8a and 8b of the substrate 5 have been pressed into the respective recess 2a and 2b and the sintering material 7 is therefore subjected to a high pressure, because the pressure acting on the sintering material 7 is no longer limited or reduced by the mechanical deformation of the first and second region 8a and 8b of the substrate 5. In FIG. 2 the sintered component arrangement 1 is shown during the pressurizing of the power semiconductor components 6a and 6b. The conversion of the sintering material 7 into the sintered metal 7' is carried out by sintering the metal particles contained in the sintering material 7. In the exemplary embodiment, the metal particles are made of silver, so that in the exemplary embodiment the sintered metal 7' is made of silver. The pressurizing of the power semiconductor components 2a or 2b in the direction of the workpiece carrier 3 is preferably carried out by means of a pressure stamp 10 of the sintering press that is movable in the direction of the pressure counterpart 11 of the sintering press. The pressure stamp 10 preferably has a metal forming body 10a and an elastic cushioning element 10b, which is arranged on the side of the metal forming body 10a facing the pressure counterpart 11. The temperature treatment of the sintering material 7 is preferably carried out by heating up the pressure counterpart 11 and/or the pressure stamp 10. In this process the heat is transmitted from the substrate 5 and/or from the power semiconductor components 2a and 2b to the sintering material 7.

As shown in the example of FIG. 2, in method step b) as a result of the recesses 2a and 2b, the substrate 5 forms bulging regions 12a and 12b that extend into the recesses 2a and 2b. As a result of the different thermal expansion coefficients of the substrate 5, in particular of the electrically non-conductive insulation layer 5a of the substrate 5 (e.g. ceramic plate), the sintered metal 7' and the power semiconductor components 2a and 2b, during subsequent cooling of these components mechanical stresses are produced between these components, which cause the bulged regions 12a and 12b to be pressed in the direction of the power semiconductor components 2a and 2b, so that the side 16 of the substrate 5 facing away from the power semiconductor components 2a and 2b after the cooling process is at least approximately flat, and therefore has no concave areas arranged flush with the power semiconductor components extending in the direction of the power semiconductor components. The substrate 5 can therefore be arranged on a metallic base plate or a heat sink with a minimal thermal contact resistance relative to the metallic base plate or the heat sink. It should be noted, however, that the size of the recesses 2a and 2b, in particular the greatest depth t of the respective recess 2a and 2b, can also be designed in such a way that during cooling of the components the bulging regions 12a and 12b do not fully disappear, and therefore after it has cooled down the side 16 of the substrate 5 facing away from the power semiconductor components 2a and 2b has residual bulging regions. The substrate 5 can in this case also be arranged on a metallic base plate or a heat sink with a minimal thermal contact resistance relative to the metallic base plate or the heat sink, because at exactly the places where the heat transfer takes place from the power semiconductor components 2a and 2b to the substrate 5 in the operation of the power semiconductor components 2a and 2b, the substrate 5 has an excellent mechanical contact with the base plate or the heat sink.

In the exemplary embodiments, the sintered component arrangement 1, as shown in FIGS. 3 to 6, has four power semiconductor components with a respective recess associated with the respective power semiconductor component in the workpiece carrier 2. The number of the power semiconductor components of the sintered component arrangement 1 with which a recess in the workpiece carrier is associated is at least two. It should be noted that recesses in the workpiece carrier 3 do not necessarily need to be arranged under all power semiconductor components of the sintered component arrangement 1. Preferably, however, all power semiconductor components of the sintered component arrangement 1 are arranged above the workpiece carrier 3 in the normal direction N1 of the first main side 5a' of the insulation layer 5a of the substrate 5, in each case flush with a respective recess of the workpiece carrier 3 associated with the respective power semiconductor component, and a respective region of the substrate 5 is arranged above the workpiece carrier 3 in the normal direction N1 of the first main side 5a' of the insulation layer 5a flush with a respective recess 2a, 2b of the workpiece carrier 3, so that recesses are preferably arranged in the workpiece carrier 3 underneath all of the power semiconductor components of the sintered component arrangement 1. In method step b) a part of this particular region of the substrate 5 is pressed into the respective recess.

It should be noted here that features of different exemplary embodiments of the invention, provided the said features are not mutually exclusive, can of course be freely combined without departing from the scope of the invention.

It is further observed that, naturally, characteristics of the various exemplary embodiments of the invention, provided that said characteristics are not mutually exclusive, can be mutually combined as desired, without departing from the scope of the invention.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A pressure sintering method, comprising the steps of:
    a) providing a sintered component arrangement with a workpiece carrier having a plurality of recesses, with a substrate, resting on a main surface of the workpiece carrier and having an electrically non-conductive insulation layer, on a first main side of which facing away from the workpiece carrier a metallization layer structured to form conductor tracks is arranged, with power semiconductor components arranged on the conductor tracks,
        wherein a sintering material to be sintered is arranged between the power semiconductor components and the conductor tracks;
    wherein a first power semiconductor component and a first region of the substrate are arranged above the workpiece carrier in the normal direction of the first main side of the insulation layer flush with a first recess of the plurality of recesses of the workpiece carrier, and a second power semiconductor component and a second region of the substrate are arranged above the workpiece carrier in the normal direction (N1) of the first main side of the insulation layer flush with a second recess of the plurality of recesses of the workpiece carrier;

wherein in method step a) the position at which the respective recess has a greatest depth (t) is arranged flush with a central region of the respective power semiconductor component in the normal direction (N1) of the first main side of the insulation layer;

wherein said greatest depth (t) of the respective recess has a value of 20 μm to 150 μm; and b) pressurizing the power semiconductor components in a direction of the workpiece carrier and applying a temperature treatment to the sintering material, wherein a portion of the first region of the substrate is pressed into the first recess of the plurality of recesses and a portion of the second region of the substrate is pressed into the second recess of the plurality of recesses and the sintering material is converted into a sintered metal.

2. The pressure sintering method, according to claim 1, wherein:

in method step (a) all power semiconductor components of the sintered component arrangement are arranged above the workpiece carrier in the normal direction (N1) of the first main side of the insulation layer, in each case flush with the respective recesses of the workpiece carrier associated with the respective power semiconductor component; and a respective region of the substrate is arranged above the workpiece carrier in the normal direction (N1) of the first main side of the insulation layer flush with the respective recesses of the workpiece carrier; and in method step (b) a portion of this respective region of the substrate is pressed into the respective recesses.

3. The pressure sintering method, according to claim 1, wherein:

in method step a) a surface of the workpiece carrier bounding the respective recess has a concave profile.

4. The pressure sintering method, according to claim 1, wherein:

a profile of the surface of the workpiece carrier, at the respective transition from the main surface of the workpiece carrier on which the substrate rests in method step a) to a surface bounding the respective recess of the workpiece carrier, is continuously differentiable.

5. The pressure sintering method, according to claim 4, wherein:

in method step a) a main surface facing the respective recess of the respective power semiconductor component in the normal direction (N1) of the first main side of the insulation layer, projected onto a virtual surface enclosed by a rim of the respective recess, whose normal direction (N2, N3) corresponds to the normal direction (N1) of the first main side of the insulation layer, is located within this virtual surface.

6. The pressure sintering method, according to claim 5, wherein:

a corner of the main surface of the respective power semiconductor component facing the respective recess in the normal direction (N1) of the first main side of the insulation layer, when projected onto the rim of the respective recess, are located on the rim of the respective recess.

7. The pressure sintering method, according to claim 4, wherein:

in method step a) a virtual surface enclosed by a rim of the respective recess whose normal direction (N2, N3) corresponds to the normal direction (N1) of the first main side of the insulation layer, in the normal direction (N1) of the first main side of the insulation layer when projected onto a main surface of the respective power semiconductor component facing the respective recesses, is located within said main surface of the respective power semiconductor component.

8. The pressure sintering method, according to claim 4, wherein:

in method step a) a rim of the recess associated with the respective power semiconductor component at non-corner regions of the respective power semiconductor component extends parallel to rim edges of the respective power semiconductor component, wherein at corner regions of the respective power semiconductor component the rim of the respective recess associated with the respective power semiconductor component has a curved profile.

9. The pressure sintering method, according to claim 8, wherein:

in method step a) the rim of the respective recess associated with the respective power semiconductor component is spaced apart from the rim edges of the respective power semiconductor component in the direction perpendicular to the normal direction (N1) of the first main side of the insulation layer, wherein the rim of the recess is arranged in the direction perpendicular to the normal direction (N1) of the first main side of the insulation layer closer to or further away from a projection of the central region of the respective power semiconductor component in the normal direction (N1) of the first main side of the insulation layer than the rim edges of the respective power semiconductor component.

10. The pressure sintering method, according to claim 1, wherein:

in method step a), in at least one of the power semiconductor components a main surface of this at least one power semiconductor component facing the respective recess has a square shape, wherein a virtual surface enclosed by the rim of the respective recess associated with the at least one power semiconductor component, whose normal direction (N2) corresponds to the normal direction (N1) of the first main side of the insulation layer, has a circular shape.

11. The pressure sintering method, according to claim 1, wherein:

in method step a) in at least one of the power semiconductor components a main surface of this at least one power semiconductor component facing the respective recess has a rectangular shape, wherein a virtual surface enclosed by the rim of the respective recess associated with this at least one power semiconductor component, whose normal direction (N3) corresponds to the normal direction (N1) of the first main side of the insulation layer, has an elliptical shape.

12. The pressure sintering method, according to claim 1, wherein:

in method step a) the workpiece carrier has at least one stop means, which counteracts a movement of the substrate in the direction perpendicular to the normal direction (N1) of the first main side of the insulation layer.

13. The pressure sintering method, according to claim 1, further comprising:
    in that between method step a) and method step b);
    in a method step a'), the sintered component arrangement is arranged on a pressure counterpart of a sintering press, and in method step b) the power semiconductor components are pressurized in the direction of the workpiece carrier, by means of a pressure stamp of the sintering press which is movable in the direction of the pressure counterpart.

* * * * *